United States Patent [19]

Hyduke

[11] Patent Number: 4,827,427

[45] Date of Patent: May 2, 1989

[54] INSTANTANEOUS INCREMENTAL COMPILER FOR PRODUCING LOGIC CIRCUIT DESIGNS

[76] Inventor: Stanley M. Hyduke, 513 Jenny Dr., Newbury Park, Calif. 91320

[21] Appl. No.: 21,925

[22] Filed: Mar. 5, 1987

[51] Int. Cl.[4] ............................................. G06F 15/20
[52] U.S. Cl. .................................... 364/489; 364/488; 364/578
[58] Field of Search ............... 364/488, 489, 490, 491, 364/300, 200, 578

[56] References Cited

U.S. PATENT DOCUMENTS

| | | | |
|---|---|---|---|
| T940,020 | 11/1975 | Brechling et al. ................... | 364/491 |
| 4,306,286 | 12/1981 | Cocke et al. ......................... | 364/488 |
| 4,342,093 | 7/1982 | Miyoshi ............................... | 364/578 |
| 4,527,249 | 7/1985 | Van Brunt ........................... | 364/578 |
| 4,584,642 | 4/1986 | Fudanuki ............................. | 364/200 |
| 4,593,363 | 6/1986 | Burstein et al. ..................... | 364/491 |
| 4,635,208 | 1/1987 | Coleby et al. ....................... | 364/491 |
| 4,638,442 | 1/1987 | Bryant et al. ....................... | 364/489 |
| 4,695,968 | 9/1987 | Sullivan, II et al. ................ | 364/578 |
| 4,697,241 | 9/1987 | Lavi ..................................... | 364/488 |
| 4,725,971 | 2/1988 | Doshi et al. ......................... | 364/578 |
| 4,736,338 | 4/1988 | Saxe et al. ........................... | 364/578 |

OTHER PUBLICATIONS

"Verifying Compiled Silicon" by Edmund K. Cheng, VLSI Design, Oct. 1984, pp. 2–4.
"Silicon Compiler Lets System Makers Design Their Own VLSI Chip" by Johnson et al., Electronic Design, Oct.

Primary Examiner—Felix D. Gruber
Assistant Examiner—V. N. Trans
Attorney, Agent, or Firm—David O'Reilly

[57] ABSTRACT

A computer aided logic design system for instantaneously compiling circuit component entries into a schematic model which provides immediate simulation of each entry or deletion into the electronic circuit schematic. The system includes software for processing logic designs which produces a signal table for storing all inputs and outputs of chips stored in a specification table. The processor also produces a call table that lists all chips from the chips specification table from which chip models can be retrieved and executed. Additionally, a software routine produces a netlist transfer table that specifies the transfer of signals within the signal table produced by software processing, which correspond to the signal distribution in the circuit being designed. After production of the signal table, specification table, call table and netlist transfer table, a software processing routine executes sequential values retrieved from the call table and netlist transfer table to create a second signal table which is compared with the first signal table. The software processing routine continuous to execute values retrieved from the call table and netlist transfer table and compare the first and second signal tables until both the second signal table being created is identical with the first signal table stored in memory. The software processing means also includes a delay which delays sequential processing until the comparing step for comparing the second signal table with the first signal table reaches a stable state.

14 Claims, 3 Drawing Sheets

INSTANTANEOUS INCREMENTAL COMPILER FOR PRODUCING LOGIC CIRCUIT DESIGNS

FIELD OF THE INVENTION

The present invention relates to computer aided generation of components for schematic entry and timing simulation, and more particularly relates to a system design means and method for instantaneous generation and compilation of schematic entry and automatic generation of design timing.

BACKGROUND OF THE INVENTION

The art of schematic entry is well established. The majority of computer aided engineering work stations allow the user to enter the graphical representations for such elements as integrated circuits, resistors, capacitors and connecting lines. Then these entries are compiled in a batch mode to produce computer meaningful data such as an element connectivity list, a parts list, an error report and simulation data.

The major disadvantage of this process is that design compilation takes a long time and is proportional to the size of the schematic. Also, even the smallest design correction requires the entire schematic to be recompiled anew. This process results in schmematic capture software that is time consuming and inconvenient to use particularly when there are numerous design changes.

Another disadvantage of the present schematic capture software is that any design error shows up only after batch compilation of the schematic, which is late in the design process.

Still another disadvantage of the present methods is that the logic simulation of the schematic design can take place only after schematic batch compilation, creating a large time delay between the schematic entry or correction and observation of its effect on the system behavior.

The biggest disadvantage of the present computer aided engineering work stations is that they are labor intensive and incapable of providing fully automated timing analysis of the logic design. The work stations can only provide the mini-max analysis that calculates the zones of uncertainty in the combinatorial circuits, which are used in a great majority of logic designs. Furthermore, the present work stations cannot calculate the digital noise filtering properties of logic devices, which is mandatory to effectively model the circuit's behavior.

BRIEF DESCRIPTION OF THE INVENTION

It is one object of the present invention to improve computer generation of the design entry and simulation and make it free from the aforementioned limitations. Specifically, it is an object of the present invention to instantaneously compile each schematic entry and provide for immediate simulation of each schematic entry or deletion.

Another object of the present invention is to automate the design simulation process by statistical analysis of a multiplicity of printed circuit boards automatically generated in software, wherein each board has components with randomly selected propagation delay values.

Another object of the present invention is to provide means for automatic filtering of noise signals created either by logic elements, radiation, or other sources.

While the specification concludes with claims that distinctly specify and claim the subject matter which is regarded as the invention, it is believed that the novel features and advantages of the invention will be more fully understood from the following detailed description in conjunction with the accompanying drawings in which:

DESCRIPTION OF THE PREFERRED EMBODIMENT

Figure 1:
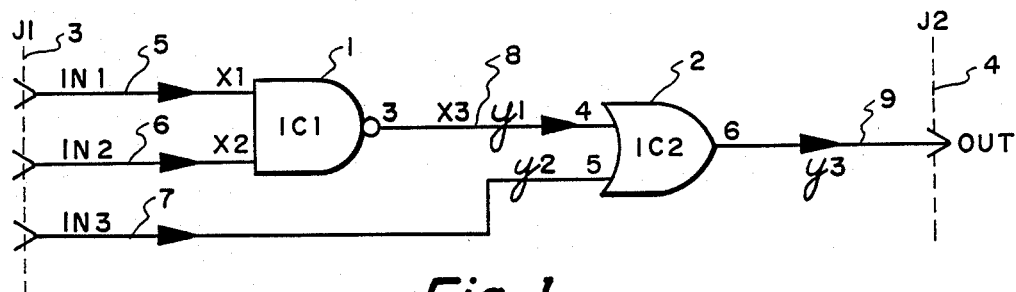
FIG. 1 illustrates a typical logic schematic diagram.
Figure 2:
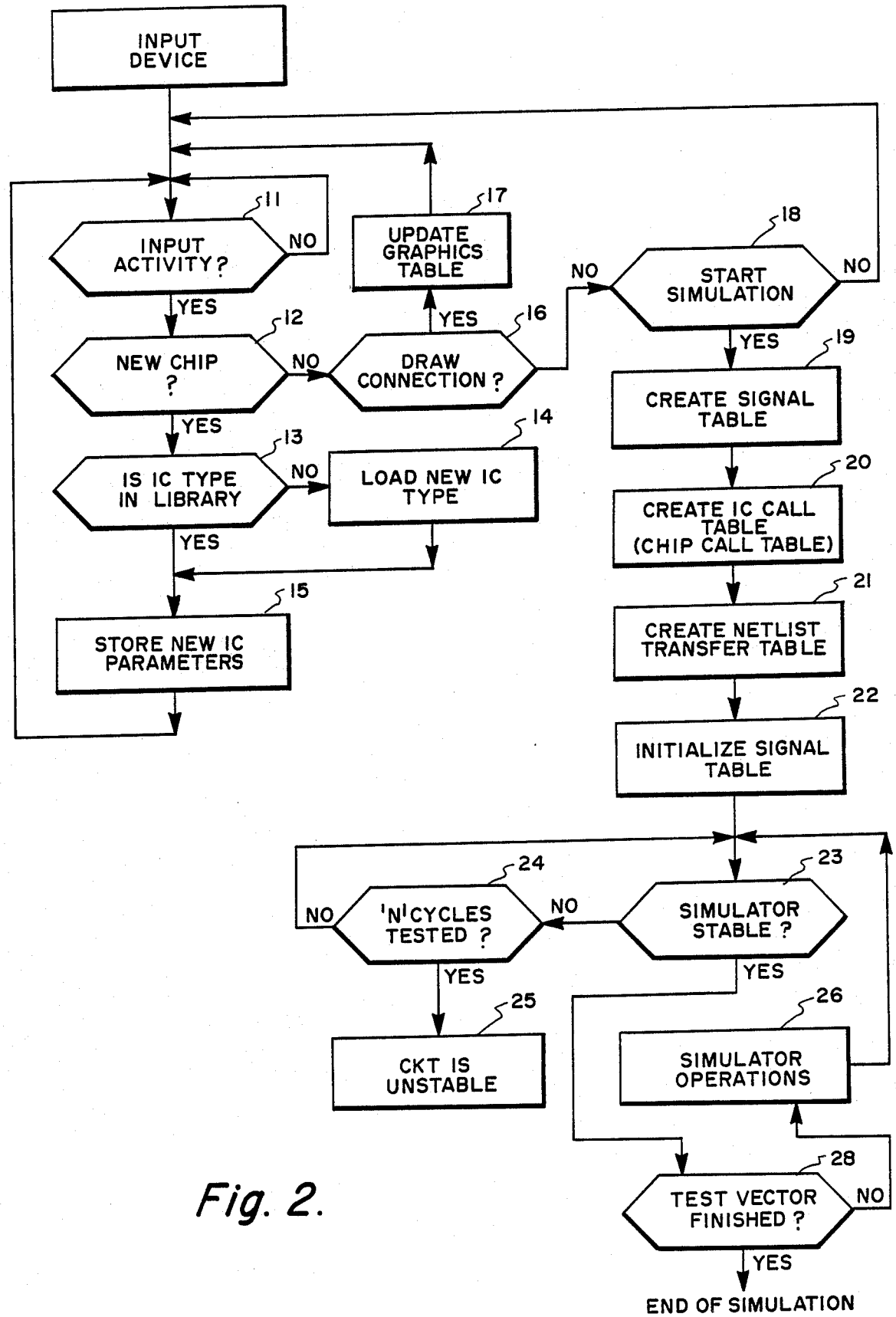
FIG. 2 is a flowchart of incremental compilation.

As shown in the schematic diagram of FIG. 1, a typical logic circuit includes NAND gate 1, OR gate 2, input connector (J1) 3, output connector (J2) 4, and connecting lines 5, 6, 7, 8 and 9. The algorithm for processing a logic circuit schematic entry is shown in FIG. 2. Input activity softwate 11 detects if there has been any keyboard, mouse device, or similar input activity from input device 10. If input activity has been detected by subroutine 11, subroutine 12 checks whether the activity was an integrated circuit related entry. To save memory and speed up processing, only actually used IC (integrated circuit) models are loaded into RAM (random access memory) and the IC models are then used by call instructions to simulate integrated circuits of the same type.

Subroutine 13 checks to see if each newly entered component chip has an equivalent model already loaded into RAM. If the IC model has not been used before; and is not yet in an IC Model Table, subroutine 14 will load that IC model from storage into the RAM based IC Model Table. The subroutine 15 keeps track of all schematic entered integrated circuits by means of a Chip Table that stores the integrated circuits by circuit names, and addresses of their IC models that are located in the IC Model Table.

IC MODEL TABLE

| IC TYPE | SUBROUTINE | ABSOLUTE ADDRESS |
|---|---|---|
| 00 | MOV al, [P1] | aa1 |
|  | NOT al |  |
|  | MOV ah, al |  |
|  | MOV al, [P2] |  |
|  | NOT al |  |
|  | OR al, ah |  |
|  | MOV [P3], al |  |
| 32 | MOV al, [P1] | aa2 |
|  | OR al, [P2] |  |
|  | MOV [P3], al |  |

P1, P2, and P3 are parametric variables, replaced by call instructions with signal addresses fromthe Signal Table.

CHIP TABLE

| SCHEMATIC IC NAME | MODEL ABSOLUTE ADDRESS | GRAPHICS DATA |
|---|---|---|
| IC1 | aa1 | XYZ1 |
| IC2 | aa2 | XYZ2 |

The Chip Table contains the IC circuit or schematic name, (e.g. IC1), and absolute address of its chip model location in the IC Model Table. In addition, the Chip Table contains graphics information about the IC connectivity and geometrical location of the chip on the schematic, and what sections of the chip are already in use.

If the input activity, as detected by the subroutine 16, was a draw connection command, then the graphics table that contains all line drawing information is updated by software subroutine 17. The graphics table is used to create netlist data and screen drafting.

If the input activity is neither a chip entry nor a line drawing then it is checked by subroutine 18 if it is simulation related. If subroutine 18 detects the start of the simulation process then it directs subroutine 19 to create a Signal Table that contains RAM space for each connector pin and each IC input and output pin. In addition, it reserves RAM space for each IC model variable that has to be carried from one simulation cycle to another, like the status of a clock and similar information.

SIGNAL TABLE

| IC-I/O | PIN/SIGNAL | ABSOLUTE ADDRESS | RELATIVE ADDRESS |
|---|---|---|---|
| J1 | IN1 | a1 | R1 |
| J1 | IN2 | a2 | R2 |
| J1 | IN3 | a3 | R3 |
| IC1 | x1 | a4 | R4 |
| IC1 | x2 | a5 | R5 |
| IC1 | x3 | a6 | R6 |
| IC2 | y1 | a7 | R7 |
| IC2 | y2 | a8 | R8 |
| IC2 | y3 | a9 | R9 |
| J2 | OUT | a10 | R10 |

Subroutine 20 creates an IC Call Table that contains the starting address of the IC model in the aforementioned IC Model Table as created by subroutine 14. In addition, it uses the relative addresses from the Signal Table to provide full specification of the call to process the selected IC.

CALL TABLE

| IC | DS REGISTER | CALL |
|---|---|---|
| IC1 | aa1 | P1=R4, P2=R5, P3=R6 |
| IC2 | aa2 | P1=R7, P2=R8, P3=R9 |

Call instructions from the Call Table use the chip models at relative locations aa1 and aa2, with the substitute logic values found at corresponding RAM locations R4, R5, R6, R7, R8, and R9.

The schematic compiler according to the present invention first processes each logic chip and then distributes the result of the processing through the logic schematic circuit. To facilitate efficient data distribution through the schematic circuit, a Netlist Transfer Table is created by software subroutine 21. The Netlist Transfer Table specifies how the data should be transferred within the Signal Table to represent the schematic netlist data transfer.

NETLIST TRANSFER TABLE

| FROM | TO |
|---|---|
| IN1 | X1 |
| IN2 | X2 |
| X3 | Y1 |
| IN3 | Y2 |
| y3 | OUT |

Software subroutine 22 initializes the Signal Table, with all signals set to logical 0. Software subroutine 23 performs one simulation cycle by executing the Call Table and Netlist Transfer Table. Following this, software subroutine 23 compares the new IC outputs with the previous ones by means of comparing the new Signal Table with the previous one. If the simulation process has resulted in even a single difference between the new Signal Table and the previous one, the simulation process is repeated until a stable condition within the circuit of FIG. 1 is achieved. Subroutine 24 counts how many simulations have been performed to stabilize the simulated circuit. If the number of simulations exceeds an arbitrarily selected number, larger than 10, then the circuit is considered unstable and rejected from further processing by software 25.

If the simulated circuit is stable, subroutine 28 checks if test vectors fed into the simulated circuit have been completed. If the test vectors have not been completed, the simulation continues and software 26 feeds new test vector signals into Signal Table addresses that represent input signals to the logic circuit schematic. Next, software subroutine 23 performs the aforementioned simulation and the process continues until either all test vectors are finished, as detected by software subroutine 28, or the circuit is determined to be unstable by software subroutines 24 and 25.

The existing techniques for simulation of logic designs are based on calculating minimum and maximum integrated circuit propagation delays. These techniques suffer from unrealistic circuit behavior evaluations and do not take into account the digital filtering properties of the logic circuits that drastically minimize the effect of design glitches. Table 1 shows minimum, average, and maximum propagation delays of the integrated circuits shown in logic circuit schematic of FIG. 1. They can be either direct catalog data, or load and temperature dependent propagation delay values, as calculated from appropriate equations not the subject of the present invention. Normally, Table 1 values would be used for calculating the timing behavior of the logic circuit of the schematic of FIG. 1. However, the present invention introduces a new method of logic circuit simulation, depicted by FIG. 3 and FIG. 4 and a Modified Call Table.

TABLE 1

Timing Model Table

| | MINIMUM PROPAGATION (nanoseconds) | | MAXIMUM PROPAGATION (nanoseconds) | |
|---|---|---|---|---|
| IC MODEL | Rising Edge | Falling Edge | Rising Edge | Falling Edge |
| 74LS00 | 5 | 3 | 22 | 15 |
| 74LS32 | 7 | 7 | 22 | 22 |
| 74AS20 | 1 | 1 | 5 | 4.5 |

TABLE 2

Quantized Model Table

| | MINIMUM PROPAGATION (nanoseconds) | | MAXIMUM PROPAGATION (nanoseconds) | |
|---|---|---|---|---|
| IC MODEL | Rising Edge | Falling Edge | Rising Edge | Falling Edge |
| 74LS00 | 2 | 1 | 11 | 8 |
| 74LS32 | 3 | 3 | 11 | 11 |
| 74AS20 | 0 | 0 | 3 | 3 |

TABLE 3

Random Circuit Table
(Randomly Selected/Quantized IC Propagation Delays)

| IC CIRCUIT NAME | RANDOM PROPAGATION DELAY (nsec) | |
|---|---|---|
| | Rising Edge | Falling Edge |
| IC1 (74LS00) | 3 | 3 |
| IC2 (74LS32) | 8 | 9 |

Figure 3:
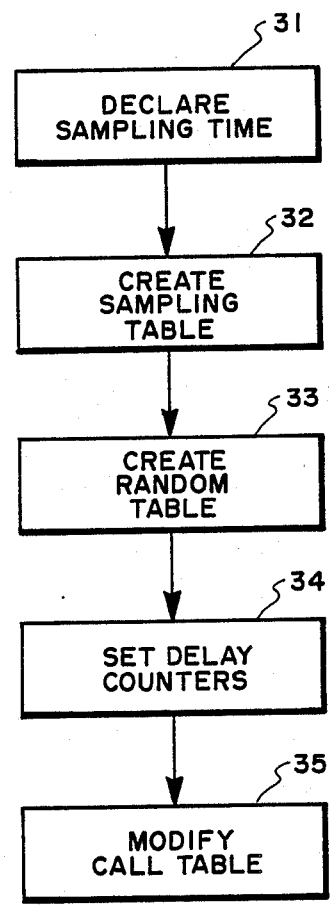
FIG. 3 is a flowchart for software processing of random data.

FIG. 3 shows a software subroutine for converting the absolute timing values in Table 1 into quantized and randomized timing values in Table 2 and Table 3 respectively. Software subroutine 31 accepts time quantization entry (e.g. 2 nanoseconds) that represents the minimum time increment used in timing analysis and feeds it into software 32 that divides the propagation delays in Table 1 by the time quantization entry. As a result of this arithmetic operation, a new table of quantized propagation delays is created. Table 2 represents Table 1 with table quantization of 2 nanoseconds. The calculations are preferably rounded off to the nearest natural number that is outside of the minimum-maximum propagation delay range listed in Table 1, rather than simply rounding off to the nearest natural number. Since ach production printed circuit board has integrated circuits with propagation delays that are random values from the quantized minimum-maximum range of Table 2, the printed circuit simulation model should have similar randomly selected propagation delays. The process of generating random numbers is described in numerous technical publications, therefore, it is not described in detail here. Software subroutine 33 produces the random number for the simulated logic circuit of FIG. 1 and can use either Monte Carlo, normal distribution, or other methods of generating a random number.

The randomly selected propagation delays for gates 1 and 2 are shown in Table 3. These random numbers can be used to insert the appropriate number of delay lines into the the outputs of gates 1 and 2. However, a considerable increase in processing speed is achieved by using time counters intstead of delay lines. Time counters count the predetermined time delays shown in Table 3 and sample functional gate IC1 and IC2 outputs when the time counter reaches the specified state, such as carry or overflow. The sampled outputs are processed and stored in the Signal Table under control of software subroutine 23.

To detect a change on the output of integrated circuits, such as IC1, or IC2, software subroutine 23 compares the previous logic device output signal, as listed in the Signal Table, with the newly calculated one during execution of the Netlist Transfer Table. The rising edges and falling edges can drive separate time counters if the modeled integrated circuit, such as IC1, or IC2, have different rising and falling edge propagation delays. Equations (1) and (2) show in detail how the rising and falling output edge for gate 1 is detected. REIC1CTR is the rising edge condition and FEIC1CTR is the falling edge condition for gate IC1. Expression X3(−1) stands for the past simulation cycle signal status, saved in Signal Table, and X3 is the current output signal from gate 1.

$$REIC1CTR = -X3(-1)*X3 \quad (1)$$

$$FEIC1CTR = X3(-1)*-X3 \quad (2)$$

$$X3 = -(X1*X2) \quad (3)$$

Software subroutine 35 modifies the Call Table to include the IC propagation delay model which is created under control of software subroutine 34, by randomly selecting quantized propagation delay numbers from Table 3 for each IC in the logic circuit of FIG. 1. Table 4 shows shoftware subroutine 35 modified Call Table.

TABLE 4

Modified Call Table

| IC | DS REGISTER | CALL |
|---|---|---|
| IC1 | aa1 | P1=R4, P2=R5 P3=R6; calculate equations (1) and (2). Preset RIC1CTR if REIC1CTR=1 Preset FIC1CTR if FEIC1CTR=1 Store P3 at R6 if RIC1CTR or FIC1CTR overflows Decrement RIC1CTR and FIC1CTR |

Figure 4:
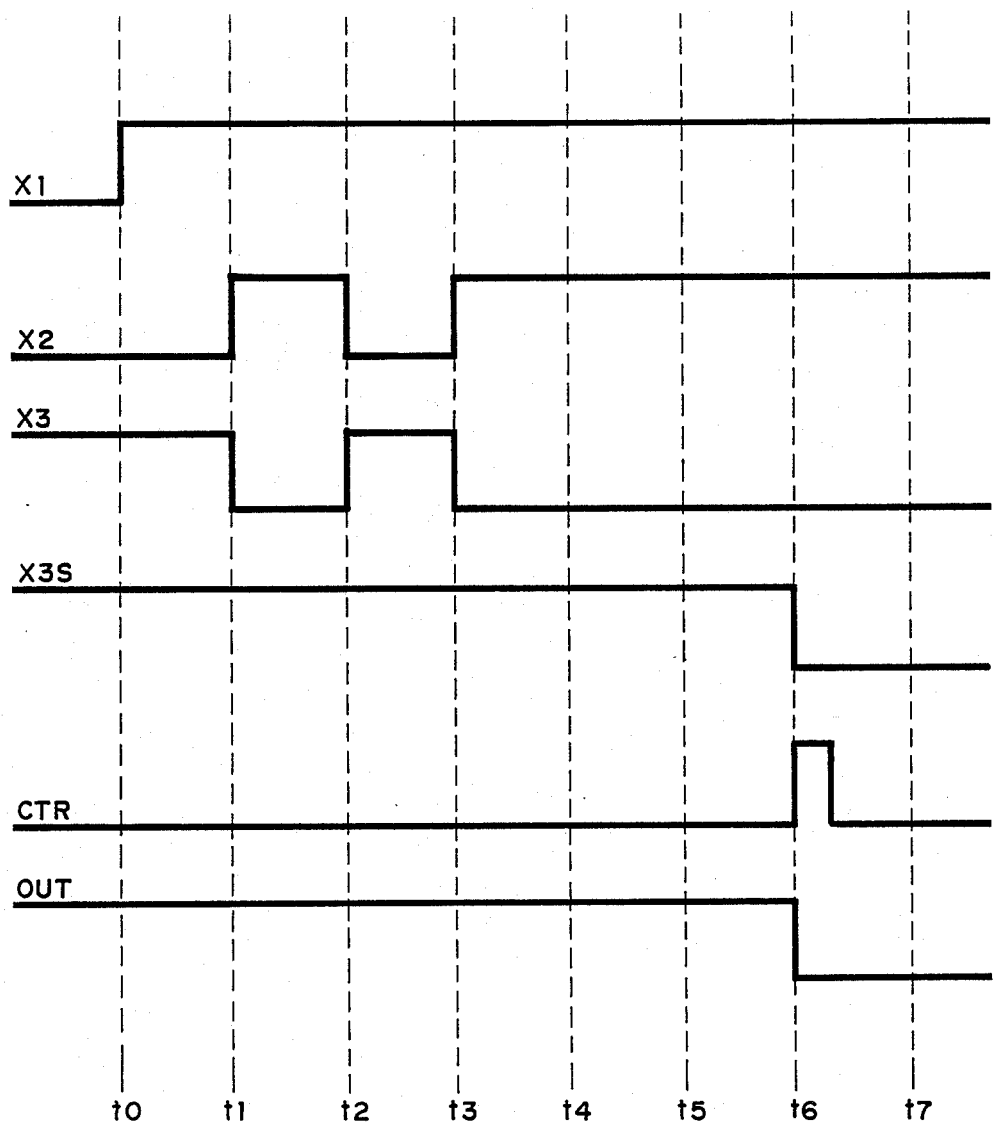
FIG. 4 is a timing diagram graph illustrating noise filtering.

The above call software calculates the current output signal X3 and checks for rising and falling edtes in the signal X3 by means of equations (1) and (2). If there has been any change in the output signal X3 from the previous simulation cycle, the time counters RIC1CTR and FIC1CTR are preset to the initial count. If there has been no X3 signal line change, the call software checks if the time counters RIC1CTR and FIC1CTR are having overflow. If there has been an overflow propagation delay timeout 10 call software loads the calculated X3 output signal value in the new Signal Table. Otherwise, call software decrements the time counters and the previous gate 1 output X3(−1) is loaded into the new Signal Table. A further insight can be gained by referring to FIG. 4, depicting gate 1 response to waveforms X1 and X2. Waveform X3 depicts gate 1 output as calculated from equation (3); and X3s represents a waveform that is loaded by call software under control of the time counters RIC1CTR and FIC1CTR. Time counter FIC1CTR is set to 3 at time t1 due to the falling edge of X3, which is detected by equation (2). Every time counter FIC1CTR is preset to the initial state, counter RIC1CTR is disabled from counting. At t2, counter RIC1CTR is preset to a count of 3, this time by the rising edge of X3 and as detected by equation (1). At the same time, time counter FIC1CTR is disabled from counting. At t3 counter FIC1CTR is again preset to a count of 3 by equation (2). If either RIC1CTR of FIC1CTR counter (time counter) has reached overflow between t1 and through t6, then during each of these simulation clock cycles the output X3(−1) from the old signal table is copied directly into the new signal table. Time counter FIC1CTR reaches overflow at time t7 and at that time values of X3s, is calculated from equation (3) and is loaded into the new signal table.

As can be seen from FIG. 4, gate 1 with random propagation delay of 6 nanoseconds, represented by a count of 3, did not react to the 2 nanosecond spikes on its inputs at times t1 and t2. This feature of the present invention automatically eliminates any signal noise that is shorter in duration than the propagation delay of the integrated circuit. As a result the digital schematic, when simulated by the present invention behaves like a digital signal filtering circuit.

This invention is not to be limited by the embodiment shown in the drawings and described in the description, which is given by way of example and not of limitation, but only in accordance with the scope of the appended claims.

What is claimed is:

1. A system for integrated circuit design and simulating operation comprising;
   storage means for storing behavorial models of integrated circuit chips;
   first circuit processing means for selecting one or more integrated circuit models from said storage means;
   automatic drawing means for automatically drawing inputs and outputs of said selected integrated circuit models to produce integrated circuit design data;
   simulating means for simulating inputs and outputs to and from said integrated circuit design;
   second storage means storing tables of electronic component specifications; said tables including:
   a signal table storing all inputs and outputs of said integrated circuit models;
   a call table storing the relative locations of said integrated circuit models for instant recall and execution;
   a netlist transfer table for specifying the transfer of signals within said signal table corresponding to the signal distribution of the electronic circuit being designed;
   said simulating means including processing means for producing, updating and storage in said signal table, said call table and said netlist transfer table;
   initializing means for initializing said signal in said table;
   said simulating means performing a simulation cycle by executing values from said call table and said netlist transfer table;
   said simulation means repeating the simulation cycle until said integrated circuit design being created achieves a stable state;
   whereby functional models of an electronic circuit can be created and instantaneously tested.

2. The system according to claim 1 in which said simulation means determines a stable state by repeatedly comparing an updated signal table with the previously updated signal table until they are identical.

3. The system according to claim 2 including delay means and for delaying the next execution of a simulation from said call and transfer tables until the integrated circuit design being tested achieves a stable state.

4. The system according to claim 3 including propagation delay inserting means for inserting compensation for propagation delays in said integrated circuit design.

5. The system according to claim 4 in which said propagation delay inserting means comprises means for generating a quantized propagation delay table; means for generating a table of randomly selected propagation delays; delay setting means for setting said delay means according to the randomly selected propagation delays in said table; and modifying means for modifying said call table with said propagation delays from said random propagation delay table.

6. The system according to claim 2 including rejection means for rejecting said integrated circuit design from further processing if more than a selected number of simulation cycles have occured without said integrated circuit design achieving a stable state.

7. The system according to claim 6 in which said rejecting means includes counting means counting the number of simulation cycles; and means for stopping the simulation processing if the number of simulation cycles exceeds a predetermined number.

8. A method of designing a circuit and simulating operating comprising;
   storing behavioral models of integrated circuit chips;
   selecting one or more integrated circuit models from said storage means;
   automatically drawing inputs and outputs to said selected integrated circuit models to produce integrated circuit design data;
   simulating inputs and outputs to and from said integrated circuit design;
   storing tables of electronic component specifications; said tables including:
   storing all inputs and outputs of said integrated circuit models in a signal table;
   storing the relative locations of said integrated circuit models for instant recall and execution in a call table;
   generating a netlist transfer table for specifying the transfer of signals within said signal table corresponding to the signal distribution of the electronic circuit being designed;
   processing the inputs and outputs of said simulation for producing, updating and storage in said signal table, said call table and said netlist transfer table;
   initializing said singal in said signal table;
   performing a simulation cycle by executing values from said call table and said netlist transfer table;
   repeating the simulation cycle until said integrated circuit design being created achieves a stable state;
   whereby functional models of an electronic circuit can be created and instantaneously tested.

9. The method according to claim 8 in which said simulation processing determines a stable state by repeatedly comparing an updated signal table with the previously updated signal table until they are identical.

10. The method according to claim 9 including delaying the next execution of a simulation from said call and netlist transfer tables until the integrated circuit design being tested achieves a stable state.

11. The system according to claim 10 including inserting for propagation delays in said integrated circuit design.

12. The method according to claim 11 in which said inserting of said inserting for propagation delay comprises generating a quantized propagation delay table; generating a table of randomly selected propagation delays; setting delay means in said integrated circuit design according to the randomly selected propagation delays in said table; and modifying said call table with said propagation delays from said random propagation delay table.

13. The method according to claim 12 including rejecting said integrated circuit design from further processing if more than a selected member of simulation cycles have occured without said integrated circuit design achieving a stable state.

14. The method according to claim 13 in which said rejection step includes counting the number of simulation cycles; and stopping simulation processing if the number of simulation cycles exceeds a predetermined number.

* * * * *